United States Patent
Kaneko

(10) Patent No.: US 12,209,328 B2
(45) Date of Patent: Jan. 28, 2025

(54) METHOD OF MANUFACTURING SEMICONDUCTOR SUBSTRATE AND EPITAXIAL GROWTH METHOD

(71) Applicants: KWANSEI GAKUIN EDUCATIONAL FOUNDATION, Hyogo (JP); TOYOTA TSUSHO CORPORATION, Nagoya (JP)

(72) Inventor: Tadaaki Kaneko, Hyogo (JP)

(73) Assignees: KWANSEI GAKUIN EDUCATIONAL FOUNDATION, Hyogo (JP); TOYOTA TSUSHO CORPORATION, Nagoya (JP)

(*) Notice: Subject to any disclaimer, the term of this patent is extended or adjusted under 35 U.S.C. 154(b) by 496 days.

(21) Appl. No.: 17/606,742

(22) PCT Filed: Apr. 24, 2020

(86) PCT No.: PCT/JP2020/017643
§ 371 (c)(1),
(2) Date: Oct. 26, 2021

(87) PCT Pub. No.: WO2020/218483
PCT Pub. Date: Oct. 29, 2020

(65) Prior Publication Data
US 2022/0220633 A1    Jul. 14, 2022

(30) Foreign Application Priority Data
Apr. 26, 2019 (JP) .................. 2019-086714

(51) Int. Cl.
*C30B 23/06* (2006.01)
*C30B 29/36* (2006.01)
*H01L 21/02* (2006.01)

(52) U.S. Cl.
CPC ............ *C30B 23/063* (2013.01); *C30B 29/36* (2013.01); *H01L 21/02378* (2013.01); *H01L 21/02631* (2013.01)

(58) Field of Classification Search
None
See application file for complete search history.

(56) References Cited

U.S. PATENT DOCUMENTS

| | | | |
|---|---|---|---|
| 5,164,012 A | 11/1992 | Hattori | |
| 6,402,836 B1 * | 6/2002 | Leycuras | ................ C30B 19/00 117/54 |

(Continued)

FOREIGN PATENT DOCUMENTS

| | | | | |
|---|---|---|---|---|
| CA | 2779961 A1 * | 6/2012 | ............. | C30B 23/00 |
| EP | 3382068 B1 * | 5/2022 | ............. | C30B 23/00 |

(Continued)

OTHER PUBLICATIONS

International Search Report of PCT/JP2020/017643 dated Jul. 28, 2020 (3 pages).

(Continued)

*Primary Examiner* — Michael Lebentritt
(74) *Attorney, Agent, or Firm* — Calfee, Halter & Griswold LLP

(57) ABSTRACT

The purpose of the present invention is to provide a novel method and apparatus of manufacturing a semiconductor substrate. Achieved are a method of manufacturing a semiconductor substrate and a manufacturing apparatus therefor, the method comprising: an installation step for installing a plurality of objects to be processed having semiconductor substrates in a stack; and a heating step for heating each of the plurality of objects to be processed such that a temperature gradient is formed in the thickness direction of the semiconductor substrate.

11 Claims, 13 Drawing Sheets

(56) References Cited

U.S. PATENT DOCUMENTS

| | | | |
|---|---|---|---|
| 11,972,949 B2 * | 4/2024 | Kaneko | ............ C30B 29/36 |
| 2013/0239879 A1 | 9/2013 | Aggarwal et al. | |

FOREIGN PATENT DOCUMENTS

| | | | | |
|---|---|---|---|---|
| JP | S49-134595 A | | 12/1974 | |
| JP | H01-093130 A | | 12/1989 | |
| JP | H03209817 A | | 9/1991 | |
| JP | H09320974 A | | 12/1997 | |
| JP | H10-270369 A | | 10/1998 | |
| JP | 2018-107383 A | | 7/2018 | |
| TW | 202046422 A | * | 12/2020 | ............ G01B 21/08 |
| WO | 2017188381 A1 | | 11/2017 | |
| WO | WO-2020218483 A1 | * | 10/2020 | ............ C30B 23/02 |
| WO | WO-2021025085 A1 | * | 2/2021 | ............ C30B 25/20 |
| WO | WO-2021060367 A1 | * | 4/2021 | ............ C30B 23/06 |

OTHER PUBLICATIONS

Extended Search Report from European Application No. 20796041.0 dated Dec. 15, 2022 (8 pages).

\* cited by examiner (a)

(b)

(c)

(d)

(a)

(b)

(a)

(b)

METHOD OF MANUFACTURING SEMICONDUCTOR SUBSTRATE AND EPITAXIAL GROWTH METHOD

CROSS-REFERENCE TO RELATED APPLICATIONS

This application is a 371 of PCT Application No. PCT/JP2020/017643, filed on Apr. 24, 2020, which claims priority to Japanese Application No. 2019-086714, filed on Apr. 26, 2019, the contents of which are hereby incorporated by reference as if recited in their entirety.

TECHNICAL FIELD

The present invention relates to a method for manufacturing a semiconductor substrate, a manufacturing apparatus therefor, and an epitaxial growth method.

BACKGROUND ART

Silicon carbide (SiC) semiconductor devices have a higher withstand voltage and higher efficiency than silicon (Si) and gallium arsenide (GaAs) semiconductor devices, and are capable of operating at higher temperature, and thus have attracted attention as high-performance semiconductor devices.

Typically, the SiC semiconductor devices are fabricated by an SiC growth. Various growth methods have been proposed for SiC crystal growth.

In a vapor phase epitaxial growth method described in Patent Literature 1, in a state where an SiC container made of a material containing SiC polycrystal is housed in a TaC container made of a material containing TaC, and a base substrate is housed in the SiC container, the TaC container is heated in an environment where an Si vapor pressure is held in the TaC container and a temperature gradient is generated. As a result, C atoms sublimated by etching an inner surface of the SiC container and Si atoms in the atmosphere are bonded to each other, so that an epitaxial layer of 3C—SiC single crystal is grown on the base substrate.

CITATION LIST

Patent Literature

Patent Literature 1: JP 2017-188381 T

SUMMARY OF INVENTION

Technical Problem

However, the invention described in Patent Literature 1 has room for improvement from the viewpoint of throughput improvement by collectively processing a plurality of substrates or the like.

An object of the present invention is to provide a novel method and apparatus for manufacturing a semiconductor substrate, and epitaxial growth method.

Solution to Problem

In order to solve the above problems, according to the present invention, a method for manufacturing a semiconductor substrate includes: installing a plurality of objects to be processed having semiconductor substrates in a stack manner; and heating each of the plurality of objects to be processed so that a temperature gradient is formed in a thickness direction of the semiconductor substrate.

As a result, it is possible to realize a method for manufacturing a semiconductor substrate that can be expected to improve throughput.

In a preferred embodiment of the present invention, in the installing, the objects to be processed are installed in a quasi-closed space.

As a result, it is possible to suitably realize a raw material transport including epitaxial growth and etching.

In a preferred embodiment of the present invention, in the installing, the objects to be processed are installed so that the adjacent semiconductor substrates face each other.

As a result, the raw material transport including the epitaxial growth and etching can be realized between the adjacent semiconductor substrates.

In a preferred embodiment of the present invention, the heating process heats the plurality of objects to be processed under an atmosphere containing atomic species constituting the semiconductor substrate.

As a result, it is possible to realize the raw material transport under the vapor pressure environment of the gas phase species containing the atomic species constituting the semiconductor substrate.

In order to solve the above problems, according to the present invention, an apparatus for manufacturing a semiconductor substrate includes: a plurality of objects to be processed having a semiconductor substrate and an installation tool; and a heating furnace capable of forming a temperature gradient in a thickness direction of the semiconductor substrate in each of the plurality of objects to be processed.

As a result, it is possible to realize an apparatus for manufacturing a semiconductor substrate that can be expected to improve throughput.

In a preferred embodiment of the present invention, the material of the installation tool is the material of the semiconductor substrate.

As a result, it is possible to realize the raw material transport under the vapor pressure environment of the gas phase species containing the atomic species constituting the semiconductor substrate.

In a preferred embodiment of the present invention, the installation tool has a through hole.

As a result, it is possible to install the objects to be processed so that the adjacent semiconductor substrates face each other.

In a preferred embodiment of the present invention, the objects to be processed include a main container capable of housing the semiconductor substrate and the installation tool.

As a result, it is possible to facilitate handling of the objects to be processed.

In a preferred embodiment of the present invention, the main container includes an upper container and a lower container that can be fitted to each other, and a gap, and the gap is formed in a fitting portion of the upper container and the lower container.

As a result, it is possible to form a quasi-closed space.

In a preferred embodiment of the present invention, the objects to be processed has a vapor supply source made of a material containing at least one of atomic species constituting the semiconductor substrate.

As a result, it is possible to realize the raw material transport under the vapor pressure environment of the gas phase species containing the atomic species constituting the semiconductor substrate.

In a preferred embodiment of the present invention, the apparatus for manufacturing a semiconductor substrate further includes a high melting point container capable of housing the objects to be processed.

As a result, it is possible to hold the vapor pressure environment.

In addition, the present invention also relates to an epitaxial growth method. That is, according to an aspect of the present invention, an epitaxial growth method includes, by arranging a plurality of semiconductor substrates in a thickness direction of the semiconductor substrates and heating the semiconductor substrates so that a temperature gradient is formed in the thickness direction of the semiconductor substrates, transporting a raw material from a semiconductor substrate disposed on a high temperature side to a semiconductor substrate disposed on a low temperature side; and crystal-growing the semiconductor substrate by taking over a polymorph of the semiconductor substrate on the low temperature side.

In a preferred embodiment of the present invention, the plurality of semiconductor substrates are crystal-grown simultaneously.

In a preferred embodiment of the present invention, a dummy substrate is disposed at substantially end portions of the plurality of arranged semiconductor substrates.

In a preferred embodiment of the present invention, the semiconductor substrate is disposed and grown in a raw material transport space exhausted through a vapor pressure space of vapor phase species containing atomic species constituting the semiconductor substrate.

In a preferred embodiment of the present invention, the semiconductor substrate is silicon carbide, and the semiconductor substrate is disposed and grown in a raw material transport space exhausted via an Si vapor pressure space.

In a preferred embodiment of the present invention, the semiconductor substrate is disposed and heated in a quasi-closed space in which an atomic number ratio Si/C exceeds 1.

In a preferred embodiment of the present invention, the semiconductor substrate is disposed and heated in the quasi-closed space in which the atomic number ratio Si/C is 1 or less.

Advantageous Effects of Invention

According to the disclosed technology, it is possible to provide a novel method for manufacturing a semiconductor substrate, manufacturing apparatus therefor, and epitaxial growth method.

Other problems, features and advantages will become apparent from a reading of the following detailed description when taken in conjunction with the drawings and claims.

DESCRIPTION OF EMBODIMENTS

Figure 1:
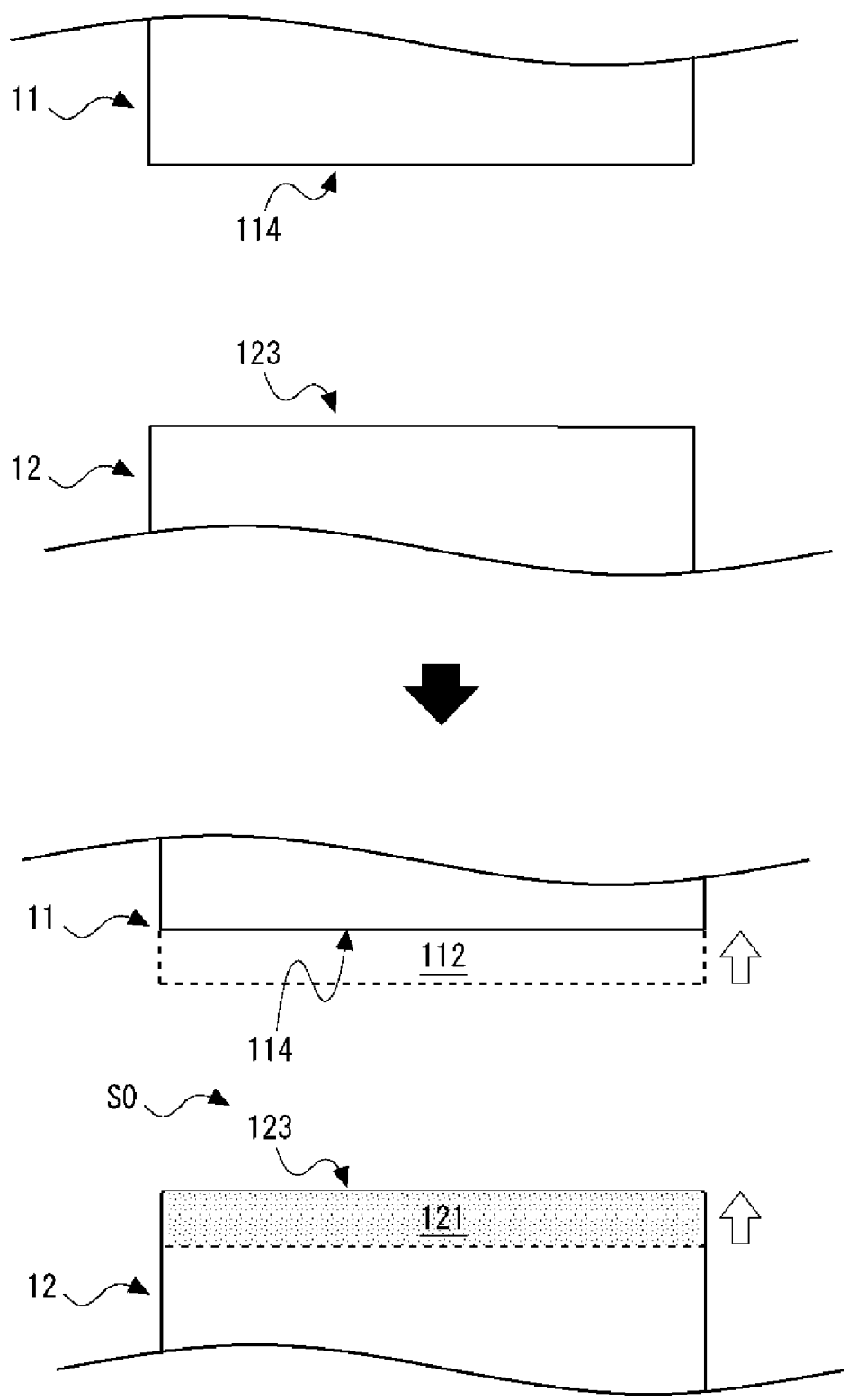
FIG. 1 is an explanatory view of a method for manufacturing a semiconductor substrate according to an embodiment of the present invention.

Hereinafter, a preferred embodiment illustrated in the drawings will be described in detail with reference to FIGS. 1 to 14. The technical scope of the present invention is not limited to the embodiments illustrated in the accompanying drawings, and can be appropriately changed within the scope described in the claims.

<<Method for Manufacturing Semiconductor Substrate>>

Hereinafter, a method for manufacturing a semiconductor substrate according to an embodiment of the present invention (hereinafter, it is simply referred to as a manufacturing method.) will be described in detail.

The present invention can be understood as a manufacturing method including at least an installation process and a heating process.

<Installation Process>

In the installation process, objects to be processed having a semiconductor substrate are installed in a stack manner.

In an embodiment of the present invention, a plurality of objects to be processed is installed so that a semiconductor substrate 11 and a member made of a material of the semiconductor substrate 11 face each other. In addition, in an embodiment of the present invention, the plurality of objects to be processed is installed such that the adjacent semiconductor substrates 11 and 12 face each other. In this case, a raw material transport space S0 is formed between the semiconductor substrate 11 and the member or between the semiconductor substrates 11 and 12.

A raw material transport in the present specification refers to a transport of a raw material gas containing atomic species constituting a semiconductor substrate. The raw material gas is preferably a gas molecule containing only the atomic species.

<Semiconductor Substrate>

Hereinafter, the semiconductor substrate including the semiconductor substrates 11 and 12 will be described in detail.

In an embodiment of the present invention, a case where the semiconductor substrate is an SiC semiconductor substrate will be exemplified.

Examples of the semiconductor substrates 11 and 12 include SiC wafers obtained by slicing an ingot fabricated by a sublimation method or the like into a disk shape, or SiC semiconductor substrates obtained by processing an SiC single crystal into a thin plate shape. Note that as a crystal polymorph of the SiC single crystal, any polytype can be adopted.

As the surface of the semiconductor substrate, a surface provided with an off angle of several degrees (for example, 0.4 to 8°) from a (0001) surface or a (000-1) surface can be exemplified (note that in the present specification, in a notation of the Miller indices, "-" means a bar attached to an index immediately after the Miller indices.).

A step-terrace structure is confirmed on the surface of the semiconductor substrate flattened at an atomic level.

The step-terrace structure is a staircase structure in which a step that is a step portion of one or more molecular layers and a terrace that is a flat portion where a {0001} surface is exposed are alternately arranged.

In the SiC semiconductor substrate, one molecular layer (0.25 nm) has a minimum height (minimum unit), and a plurality of molecular layers overlap to form various step heights. In the description of the present specification, a step that becomes large by bundling (bunching) and has a height exceeding one unit cell of each polytype is referred to as macro step bunching (MSB).

That is, the MSB is a step of bunching more than four molecular layers (equal to or larger than five molecular layers) in a case of 4H—SiC, and is a step of bunching more than six molecular layers (equal to or larger than seven layers) in a case of 6H—SiC.

The MSB is preferably not formed on the surface of the semiconductor substrate because defects due to the MSB occur on the surface during the formation of the growth layer or the MSB is one of factors of inhibiting oxide film reliability in the SiC semiconductor device.

As the sizes of the semiconductor substrates 11 and 12, wafer sizes of 6 inches or more, such as 6 inches and 8 inches, can be exemplified from a chip size of several centimeters square.

The semiconductor substrate 11 has a main surface 113 (not illustrated) and a back surface 114. In addition, the semiconductor substrate 12 has a main surface 123 and a back surface 124 (not illustrated).

In the description of the present specification, the surface refers to both the main surface and the back surface. One surface refers to any one of the main surface and the back surface, and the other surface refers to a surface of the same substrate facing one surface.

In the description of the present specification, the growth layer 111 refers to a layer formed on the semiconductor substrate 11 that is not processed. The growth layer 121 refers to a layer formed on the semiconductor substrate 12 that is not processed.

On the surface of the growth layer formed on the surface of the semiconductor substrate, preferably, basal plane dislocation (BPD) density is reduced as much as possible. Therefore, the BPD density of the surface of the semiconductor substrate is preferably reduced as much as possible. In addition, in the formation of the growth layer, the BPD is preferably converted into other defects/dislocations including threading edge dislocation (TED).

The material of the semiconductor substrate according to the embodiment of the present invention is not particularly limited.

Examples of the material of the semiconductor substrate can include a compound semiconductor material containing aluminum nitride (AlN), gallium nitride (GaN), and the like.

In addition, any material that is generally used in manufacturing the semiconductor substrate can be naturally adopted. The material of the semiconductor substrate is, for example, a known group IV material such as silicon (Si), germanium (Ge), or diamond (C). In addition, the material of the semiconductor substrate is, for example, known group IV-IV compound materials such as silicon carbide (SiC). In addition, the material of the semiconductor substrate is known group II-VI compound materials such as zinc oxide (ZnO), zinc sulfide (ZnS), zinc selenide (ZnSe), cadmium sulfide (CdS), or cadmium telluride (CdTe). In addition, examples of the material of the semiconductor substrate include known III-V group compound materials such as boron nitride (BN), gallium arsenide (GaAs), gallium nitride (GaN), aluminum nitride (AlN), indium nitride (InN), gallium phosphide (GaP), indium phosphide (InP), and indium antimonide (InSb). In addition, the material of the semiconductor substrate is, for example, oxide materials such as aluminum oxide ($Al_2O_3$) or gallium oxide ($Ga_2O_3$). Note that the semiconductor substrate may have a configuration in which the known additive atoms used according to the material of the semiconductor substrate are appropriately added.

A transport distance D0, which is a distance between the semiconductor substrate 11 and the member made of the material of the semiconductor substrate 11 or the semiconductor substrate 12 in the installation process, is preferably 100 mm or less, more preferably 50 mm or less, more preferably 20 mm or less, more preferably 10 mm or less, still more preferably 7 mm or less, still more preferably 5 mm or less, still more preferably 3.5 mm or less, still more preferably 3 mm or less, and still more preferably 2.7 mm or less. The transport distance D0 is preferably greater than or equal to 0.7 mm, more preferably greater than or equal to 1.0 mm, more preferably greater than or equal to 1.2 mm, still more preferably greater than or equal to 1.5 mm, and still more preferably greater than or equal to 1.7 mm.

<Heating Process>

In the heating process according to the embodiment of the present invention, each of the plurality of objects to be processed is heated so that a temperature gradient is formed in the thickness direction of the semiconductor substrates 11 and/or 12.

Note that in the present specification, the case where the semiconductor substrate including the semiconductor substrates 11 and 12 is the SiC semiconductor substrate will be described in detail.

In the heating process, as an example, a raw material transport space S0 having a temperature gradient is formed so that the semiconductor substrate 11 is on the high temperature side and the semiconductor substrate 12 or the member made of the material of the semiconductor substrate 11 is on the low temperature side. Therefore, it can be understood that the heating process includes the raw material transport process.

Note that in the embodiment of the present invention, the semiconductor substrate 11 may be on the low temperature side, and the semiconductor substrate 12 or the member made of the material of the semiconductor substrate 11 may be on the high temperature side.

Figure 2:
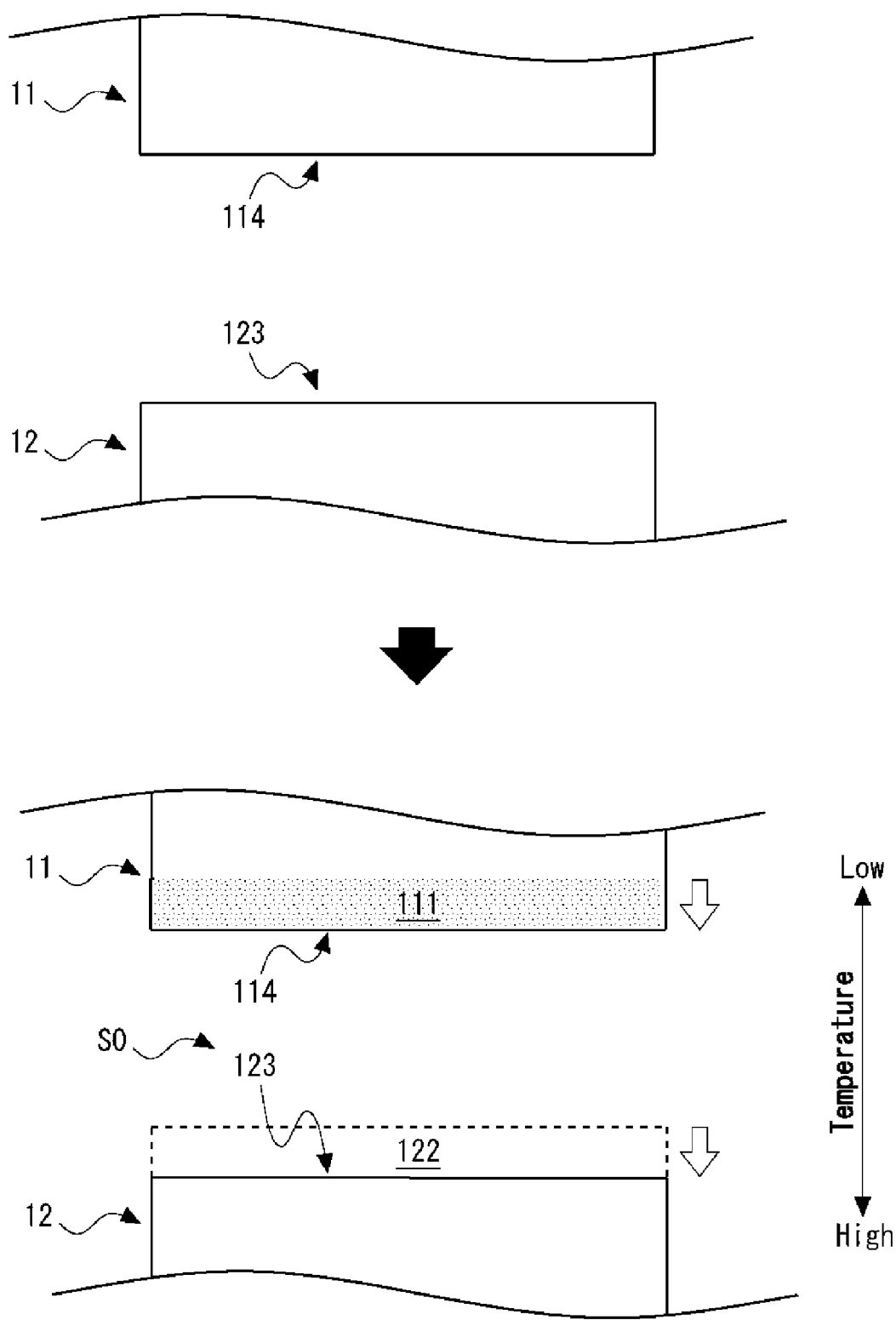
FIG. 2 is an explanatory view of the method for manufacturing a semiconductor substrate according to the embodiment of the present invention.
Figure 3:
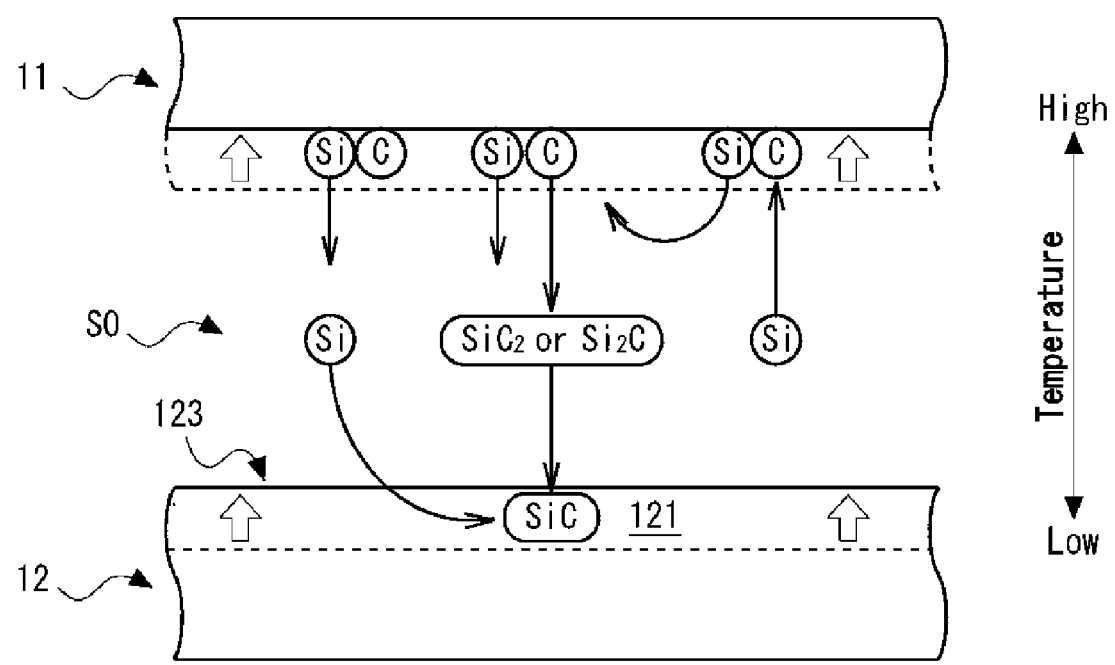
FIG. 3 is an explanatory view of the method for manufacturing a semiconductor substrate according to the embodiment of the present invention.

FIGS. 1 to 3 illustrates the raw material transport when the adjacent semiconductor substrates 11 and 12 according to the embodiment of the present invention face each other.

As illustrated in FIG. 1, the semiconductor substrate 11 is installed on the high temperature side of the temperature gradient, and thus, the etching of the back surface 114 and the formation of the growth layer 121 on the main surface 123 are simultaneously performed.

As illustrated in FIG. 2, the semiconductor substrate 11 is installed on the low temperature side of the temperature gradient, and thus, the formation of the growth layer 111 on the back surface 114 and the etching of the main surface 123 are simultaneously performed.

The heating process preferably heats the semiconductor substrates 11 and 12 in the quasi-closed space.

In the description of the present specification, the quasi-closed space refers to a space in which the inside of the space can be evacuated but at least a part of the vapor generated inside the space can be confined.

<Raw Material Transport Process>

As illustrated in FIG. 3, in the raw material transport space S0 according to the embodiment of the present invention, it can be understood that the raw material transport is continuously performed based on the following reactions 1) to 5), and as an example, the growth layer 121 is formed $$SiC(s) \rightarrow Si(v) + C(s) \quad 1)$$

$$2C(s) + Si(v) \rightarrow SiC_2(v) \quad 2)$$

$$C(s) + 2Si(v) \rightarrow Si_2C(v) \quad 3)$$

$$Si(v) + SiC_2(v) \rightarrow 2SiC(s) \quad 4)$$

$$Si_2C(v) \rightarrow Si(v) + SiC(s) \quad 5)$$

Description of 1): When the back surface 114 of the semiconductor substrate 11 is thermally decomposed, Si atoms (Si(v)) are desorbed from the back surface 114.

Descriptions of 2) and 3): C(C(s)) remaining on the back surface 114 due to the desorption of Si atoms (Si(v)) reacts with Si vapor (Si(v)) in the raw material transport space S0 to become $Si_2C$, $SiC_2$, or the like and sublimate into the raw material transport space S0.

Description of 4) and 5): Sublimed $Si_2C$, $SiC_2$, or the like reaches and diffuses into the terrace of the main surface 123 of the semiconductor substrate 12 due to the temperature gradient, and reaches the step, so the polymorph of the main surface 123 is taken over, and the growth layer 121 is grown and formed (step flow growth).

The raw material transport process includes an Si atom sublimation process of thermally sublimating Si atoms from the semiconductor substrate 11, and a C atom sublimation process of sublimating C atoms remaining on the back surface 114 of the semiconductor substrate 11 by bonding the C atoms to the Si atoms in the raw material transport space S0.

The raw material transport process includes an etching process of etching the surface of the semiconductor substrate as a transport source of the raw material based on the Si atom sublimation process and the C atom sublimation process.

The raw material transport process includes a growth process of forming the growth layer based on the step flow growth on the surface of the semiconductor substrate as a transport destination of the raw material.

In the growth process, it can be understood that $Si_2C$, $SiC_2$, or the like diffused in the raw material transport space S0 is supersaturated and coagulates at the transport destination.

It can be understood that the growth process is based on physical vapor transport.

It can be understood that a driving force of the raw material transport according to the embodiment of the present invention is a vapor pressure difference between the semiconductor substrates 11 and 12 due to the formed temperature gradient.

Therefore, not only the temperature difference on the surfaces of each of the semiconductor substrates 11 and 12 but also a chemical potential difference due to the crystal structure of the surface of the SiC material or the like facing each other can be understood as the driving force of the raw material transport.

In the raw material transport according to the embodiment of the present invention, the transport source or the transport destination may not be the semiconductor substrate. Specifically, all of the semiconductor substrate materials forming the quasi-closed space can be a transport source or a transport destination.

That is, the raw material transport is also performed between the semiconductor substrate 11 and the member made of the material of the semiconductor substrate 11.

In the raw material transport according to the embodiment of the present invention, a doping concentration of the growth layer 111 can be adjusted by supplying a dopant gas into the quasi-closed space using a dopant gas supply means. On the other hand, when the dopant gas is not supplied, the growth layer 111 or 121 is formed by taking over the doping concentration in the quasi-closed space.

The raw material transport according to the embodiment of the present invention is preferably performed under a vapor pressure environment having gas phase species containing an Si element and gas phase species containing a C element, more preferably performed under an SiC—Si equilibrium vapor pressure environment, and more preferably performed under an SiC—C equilibrium vapor pressure environment.

In the description of the present specification, the SiC—Si vapor pressure environment refers to an environment of vapor pressure when SiC (solid) and Si (liquid phase) are in a phase equilibrium state via a gas phase. In addition, the SiC—C equilibrium vapor pressure environment refers to the vapor pressure environment when the SiC (solid phase) and the C (solid phase) are in a phase equilibrium state via the gas phase.

The SiC—Si equilibrium vapor pressure environment according to the embodiment of the present invention is formed by heating the quasi-closed space in which the atomic number ratio Si/C exceeds 1. In addition, the SiC—Si equilibrium vapor pressure environment according to the embodiment of the present invention is formed by heating the quasi-closed space in which the atomic number ratio Si/C is 1 or less.

The heating temperature according to the embodiment of the present invention is preferably set in a range of 1400 to 2300° C., and more preferably set in a range of 1600 to 2000° C.

The heating time according to the embodiment of the present invention can be set to any time so as to obtain a desired etching amount. For example, when the etching rate is 1 μm/min and the etching amount is set to be 1 μm, the heating time is 1 minute.

The temperature gradient according to the embodiment of the present invention is set, for example, in a range of 0.1 to 5° C./mm.

The temperature gradient according to the embodiment of the present invention is preferably uniform in the raw material transport space S0.

The etching amount and the growth amount according to the embodiment of the present invention are, for example, in a range of 0.1 to 20 μm, but are appropriately changed as necessary.

The etching rate and the growth rate of the growth layer according to the embodiment of the present invention can be controlled by the temperature region, and can be set in a range of, for example, 0.001 to 2 μm/min.

It can be understood that the etching amount and the growth amount according to the embodiment of the present invention are equivalent.

It can be understood that the heating process according to the embodiment of the present invention includes a bunching decomposition process of decomposing and suppressing the formation of the MSB on the surface of the semiconductor substrate based on the etching process.

The surface layer on the semiconductor substrate etched in the etching process according to the embodiment of the present invention can be understood as a work-affected layer into which processing damage such as scratches, latent scratches, and distortion is introduced through mechanical processing (for example, slicing, grinding, and polishing) or laser processing, for example.

<<Apparatus for Manufacturing Semiconductor Substrate>>

Hereinafter, an apparatus for manufacturing a semiconductor substrate (hereinafter, simply referred to as a manufacturing apparatus.) according to an embodiment of the present invention will be described in detail with reference to FIGS. 4 to 10. Note that constituent elements that are basically the same as those described in the above manufacturing method are denoted by the same reference numerals, and the description thereof will be simplified.

The manufacturing apparatus according to the embodiment of the present invention includes at least objects to be processed, a heating furnace 30, and a high melting point container 40.

The objects to be processed according to the embodiment of the present invention refer to an assembly 10 and a main container 20. In addition, the objects to be processed according to the embodiment of the present invention may refer to the assembly 10.

<Assembly>

The assembly 10 includes the raw material transport space S0, the semiconductor substrate 11, the semiconductor substrate 12 or the member made of the material of the semiconductor substrate 11, and an installation tool 13. In addition, the processing unit 100 includes the installation tool 13, the semiconductor substrates 11 and 12, or a dummy substrate 14 described later. Details of the raw material transport space S0 and the semiconductor substrates 11 and 12 are as described above.

Note that the assembly 10 includes one semiconductor substrate 11 or one or more processing units 100. In the following description, a case where the assembly 10 includes a plurality of processing units 100 will be exemplified.

<Installation Tool>

The installation tool 13 has an upper edge 13A and a lower edge 13B or a bottom portion 13C.

The upper edge 13A and the lower edge 13B have a through hole in a substantially central portion. In the example illustrated in FIG. 5, an inner diameter of the through hole of the lower edge 13B is smaller than that of the through hole of the upper edge 13A.

The upper edge 13A and the lower edge 13B having such through holes are stacked in multiple stages, and the semiconductor substrate 11 can be installed in multiple stages. That is, at least a part of an upper bottom surface of the lower edge 13B can be used as an abutting surface with the semiconductor substrate 11.

The upper edge 13A supports an upper installation tool 13. The lower edge 13B supports at least a part of an outer peripheral edge of the semiconductor substrate. A bottom portion 13C is disposed at the lowermost portion, an upper portion thereof, or the like instead of the lower edge 13B as necessary.

Each of the upper bottom surface of the upper edge 13A and the lower bottom surface of the lower edge 13B may be provided with protrusions and grooves for installing different installation tools 13, respectively, by fitting or the like.

In addition to the bottom portion 13C, the installation tool 13 may have a lid portion 13D facing the semiconductor substrates 11 and 12 or the dummy substrate 14.

The installation tool 13 holds the semiconductor substrate 11, the semiconductor substrate 12, the dummy substrate 14, or the member made of the semiconductor substrate 11 so as to be adjacent to each other, substantially parallel to each other, and separated from each other by the transport distance D0. The details of the transport distance D0 are as described above. The transport distance D0 may be set small/large at substantially an end portion of the assembly 10.

One or more dummy substrates 14 are installed at substantially the end portion of the assembly 10. Note that the number of the dummy substrates 14 is not limited, and the assembly 10 may not include the dummy substrate 14.

The material of the dummy substrate 14 is preferably the material of the semiconductor substrates 11 and 12, but its crystallinity may not be the same as that of the semiconductor substrates 11 and 12. Specifically, the semiconductor substrates 11 and 12 may be a single crystal substrate, and the dummy substrate 14 may be a polycrystalline substrate.

Figure 4:
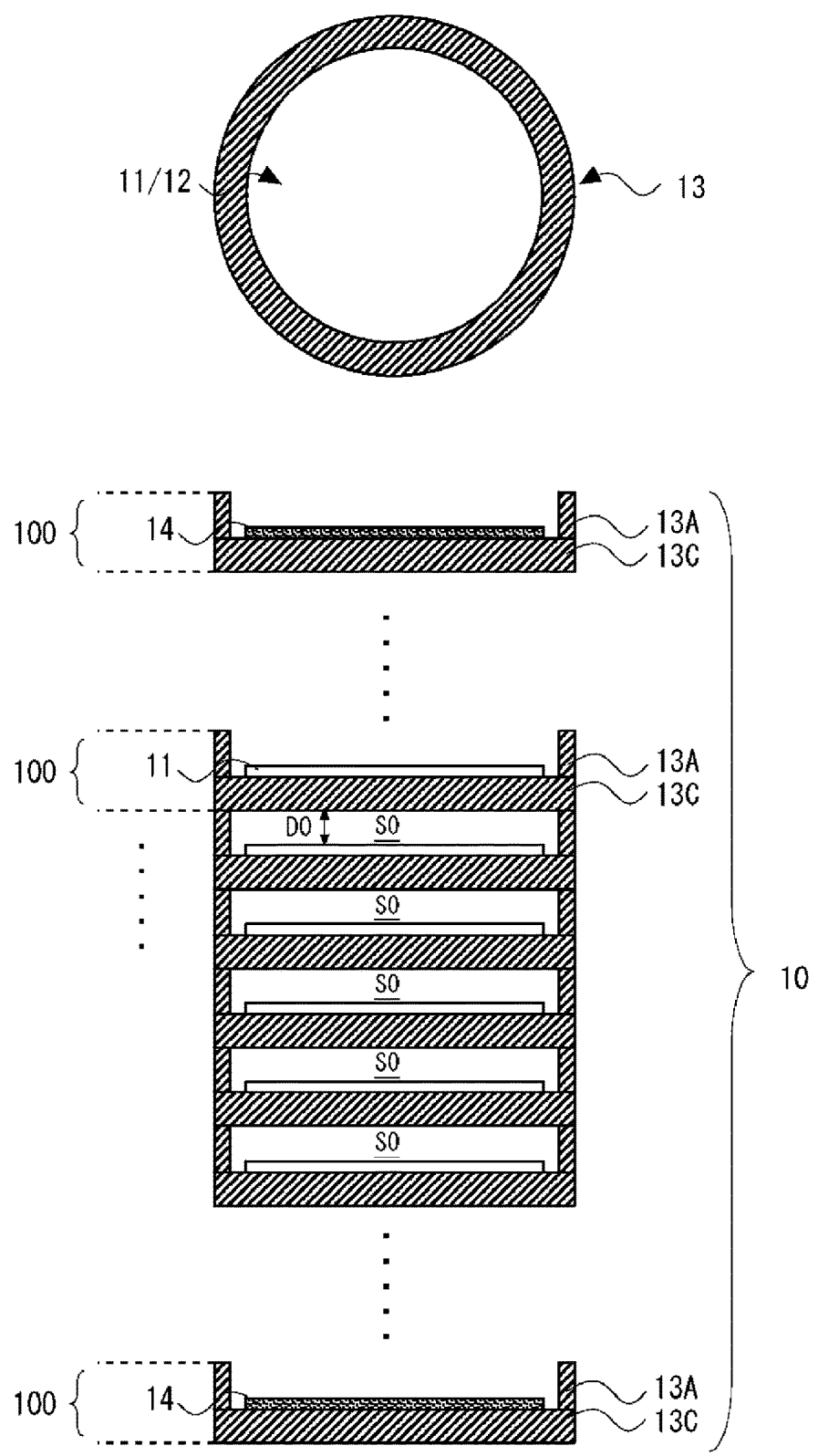
FIG. 4 is an explanatory view of an apparatus for manufacturing a semiconductor substrate according to an embodiment of the present invention.

As illustrated in FIG. 4, the processing unit 100 according to the embodiment of the present invention includes the semiconductor substrate 11 or the dummy substrate 14, and the installation tool 13 including the upper edge 13A and the bottom portion 13C. The raw material transport space S0 is formed between the semiconductor substrate 11 or the dummy substrate 14 and the bottom portion 13C. Further, an abutting surface 131 is formed on the entire one surface of the semiconductor substrate 11 or the dummy substrate 14.

Figure 5:
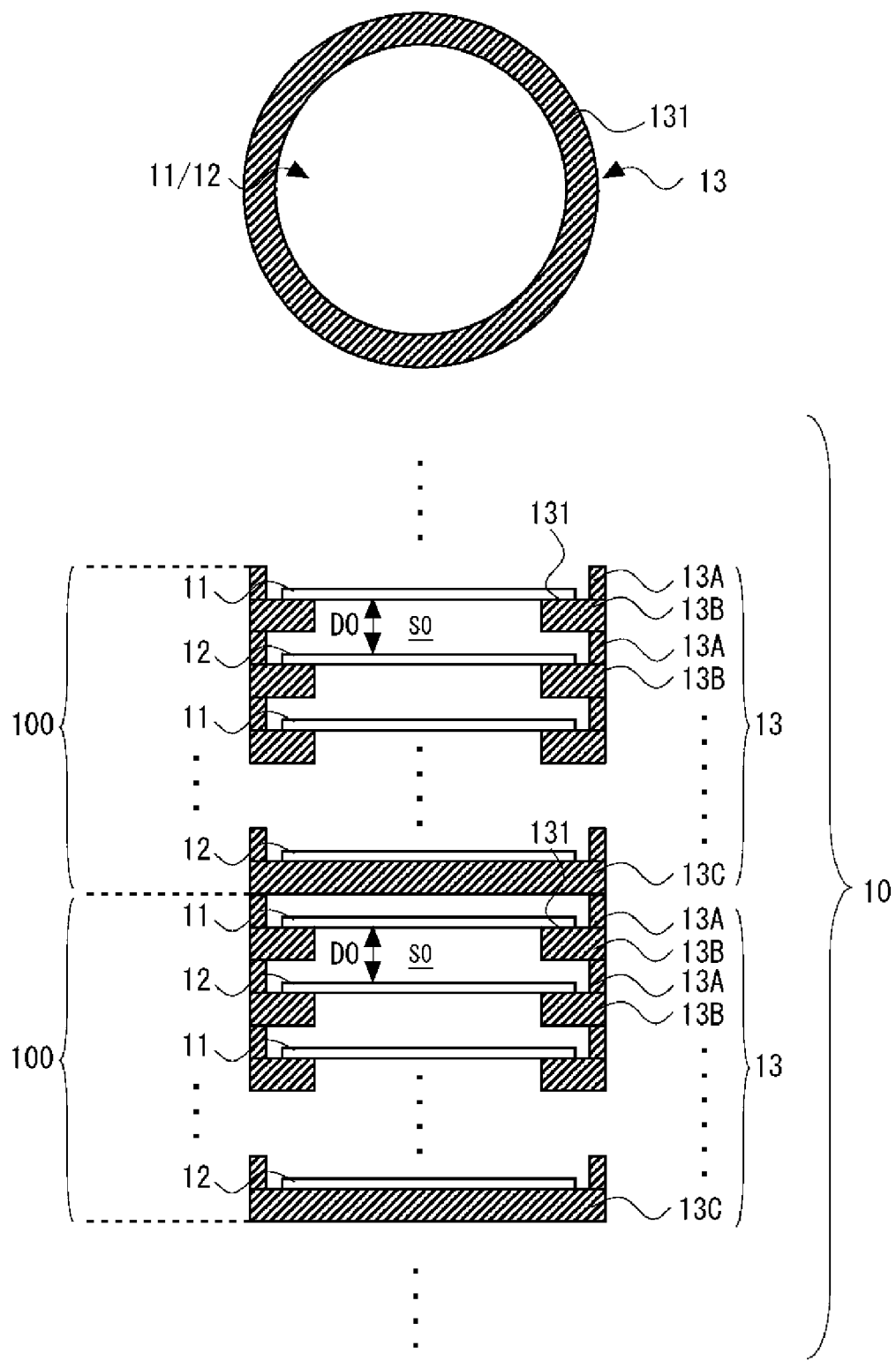
FIG. 5 is an explanatory view of the apparatus for manufacturing a semiconductor substrate according to the embodiment of the present invention.

As illustrated in FIG. 5, the processing unit 100 according to the embodiment of the present invention includes the semiconductor substrates 11 and 12 or the dummy substrate 14, the installation tool 13 including the upper edge 13A and the lower edge 13B, and the installation tool 13 including the upper edge 13A and the bottom portion 13C. In this case, the installation tool 13 at the end portion of the processing unit 100 includes the upper edge 13A and the bottom portion 13C. Therefore, the semiconductor substrates 11 and 12 face each other, and the raw material transport space S0 is formed between the semiconductor substrates 11 and 12. In addition, the abutting surface 131 is formed on the entire one surface or the entire outer peripheral edge of the semiconductor substrates 11 and 12 or the dummy substrate 14.

Figure 6:
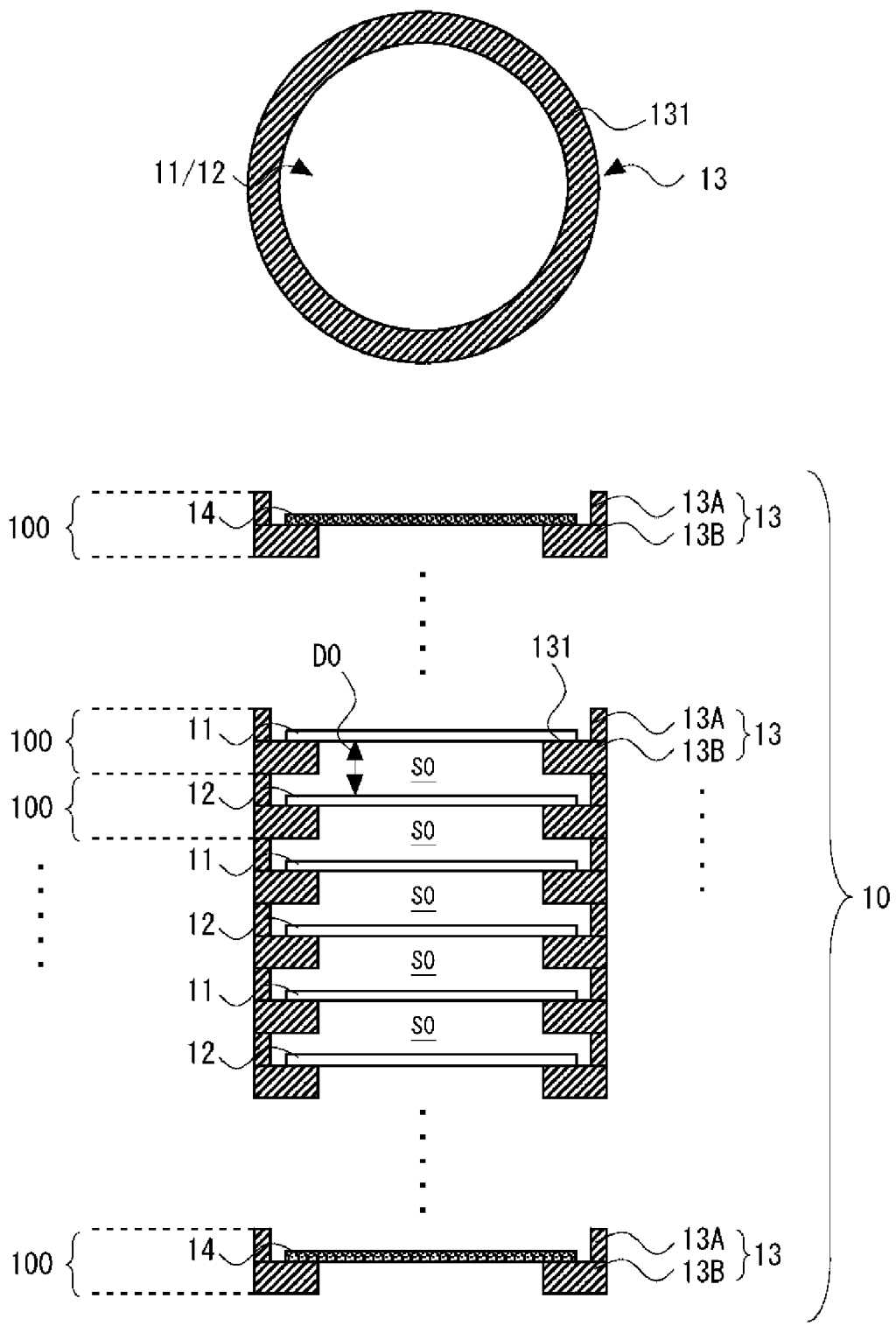
FIG. 6 is an explanatory view of the apparatus for manufacturing a semiconductor substrate according to the embodiment of the present invention.

As illustrated in FIG. 6, the processing unit 100 according to the embodiment of the present invention includes the semiconductor substrates 11 and 12 or the dummy substrate 14, and the installation tool 13 including the upper edge 13A and the lower edge 13B. In this case, the semiconductor substrates 11 and 12 face each other, and the raw material transport space S0 is formed between the semiconductor substrates 11 and 12. Further, the abutting surface 131 is formed on the entire outer peripheral edge of the semiconductor substrate 11 or the dummy substrate 14.

Figure 7:
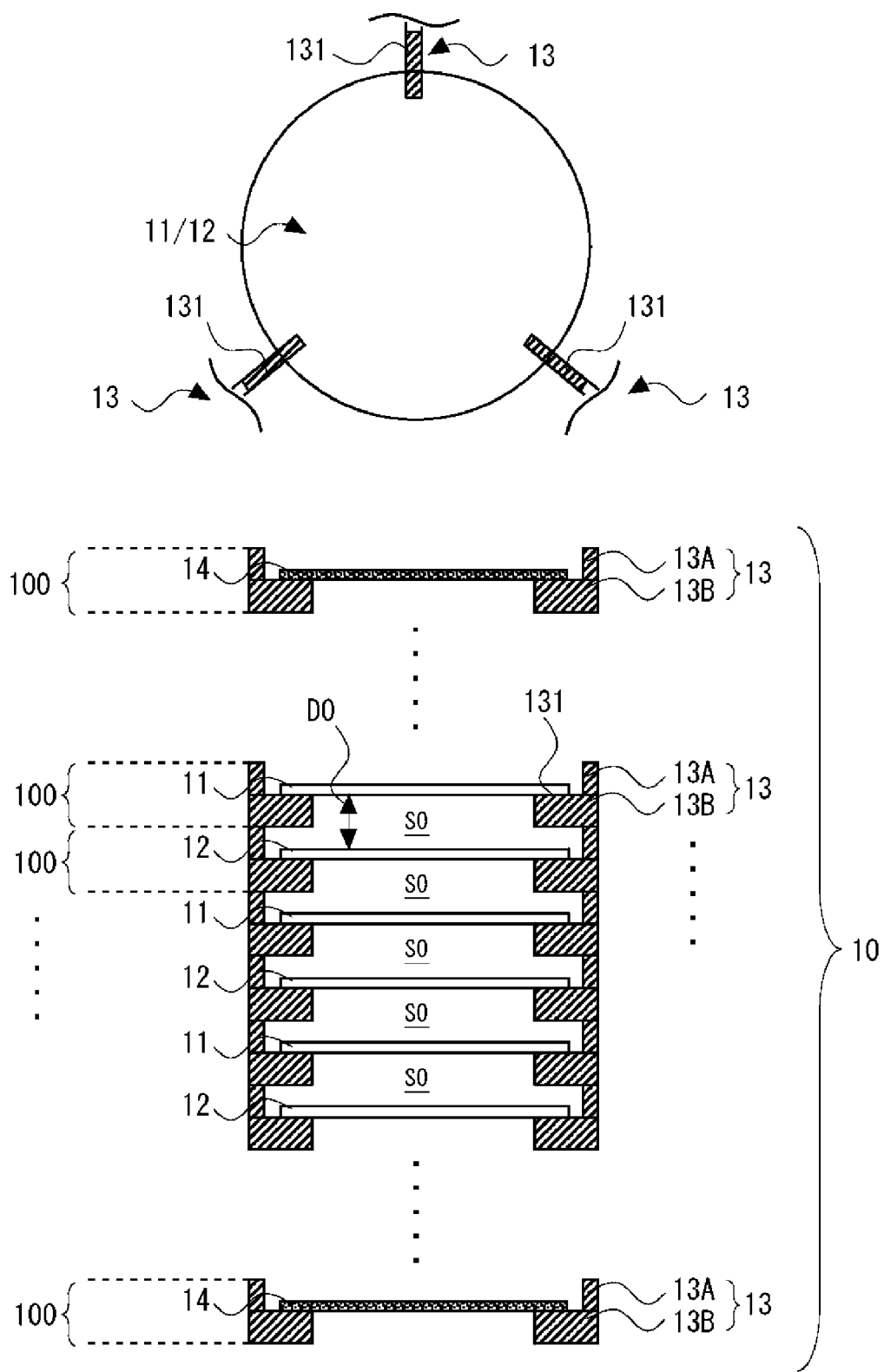
FIG. 7 is an explanatory view of the apparatus for manufacturing a semiconductor substrate according to the embodiment of the present invention.

As illustrated in FIG. 7, the processing unit 100 according to the embodiment of the present invention includes the semiconductor substrates 11 and 12 or the dummy substrate 14, and the installation tool 13 including the upper edge 13A and the lower edge 13B. In this case, the semiconductor substrates 11 and 12 face each other, and the raw material transport space S0 is formed between the semiconductor substrates 11 and 12. Further, the abutting surface 131 is formed on a portion of outer peripheral edge of the semiconductor substrate 11 or the dummy substrate 14. Any known support means, such as a configuration that holds the semiconductor substrates 11 and 12 and the dummy substrate 14 and supports or sandwiches at least a part of the outer peripheral edge, can be naturally adopted.

The width of the outer peripheral edge including the abutting surface 131 according to the embodiment of the present invention is appropriately determined.

<Main Container>

Figure 8:
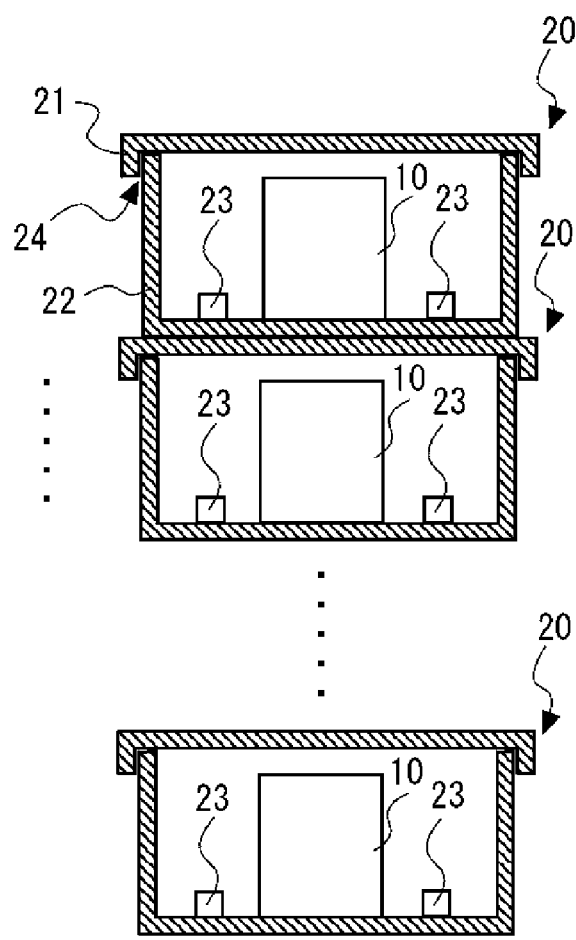
FIG. 8 is an explanatory view of the apparatus for manufacturing a semiconductor substrate according to the embodiment of the present invention.

As illustrated in FIG. 8, the main container 20 can house the assembly 10. The plurality of main containers 20 according to the embodiment of the present invention may be installed in a stack manner.

The main container 20 is a fitting container including an upper container 21 and a lower container 22 that can be fitted to each other. A minute gap 24 is formed in a fitting portion between the upper container 21 and the lower container 22, and the inside of the main container 20 can be exhausted (evacuated) from the gap 24.

It is preferable that the environment in the heat-treated main container 20 is the vapor pressure environment of the mixed system of the gas phase species containing the Si element and the gas phase species containing the C element. Examples of the gas phase species containing the Si element can include Si, $Si_2$, $Si_3$, $Si_2C$, $SiC_2$, and SiC. In addition, examples of the gas phase species containing the C element include $Si_2C$, $SiC_2$, SiC, and C.

The structure can be adopted as long as the vapor pressure of the gas phase species containing the Si element and the gas phase species containing the C element is generated in the internal space during the heat treatment of the main container 20. As an example, a configuration in which the SiC polycrystal is exposed on a part of the inner surface, a configuration in which the SiC polycrystal is separately installed in the main container 20, and the like can be illustrated.

The main container 20 includes a vapor supply source 23.

The vapor supply source 23 is used for the purpose of adjusting an atomic number ratio Si/C of the quasi-closed space in the main container 20 to exceed 1.

The vapor supply source 23 may be installed in the internal space of the assembly 10. Specifically, the vapor supply source 23 is installed on an inner wall or the like of the upper edge 13A or the lower edge 13B of the installation tool 13.

Examples of the vapor supply source 23 can include solid Si (Si pellet such as Si single crystal piece or Si powder) and an Si compound.

For example, as in an embodiment of the present invention, when the entire main container 20 is made of SiC polycrystal, the atomic number ratio Si/C in the main container 20 exceeds 1 by installing the vapor supply source 23. Specifically, when the semiconductor substrates 11 and 12 satisfying a stoichiometric ratio 1:1 and the vapor supply source 23 are installed in the SiC polycrystal main container 20 satisfying the stoichiometric ratio 1:1, the atomic number ratio Si/C in the main container 20 exceeds 1.

As described above, by heating the space where the atomic number ratio Si/C exceeds 1, it is possible to bring the space close to the environment of the vapor pressure (SiC—Si equilibrium vapor pressure environment) when SiC (solid) and Si (liquid phase) are in the phase equilibrium state via the gas phase.

The dopant and doping concentration of the main container 20 can be selected according to the dopant and doping concentration of the growth layer 111 or 121 to be formed. Examples of the dopant include an N element.

<Heating Furnace>

Figure 9:
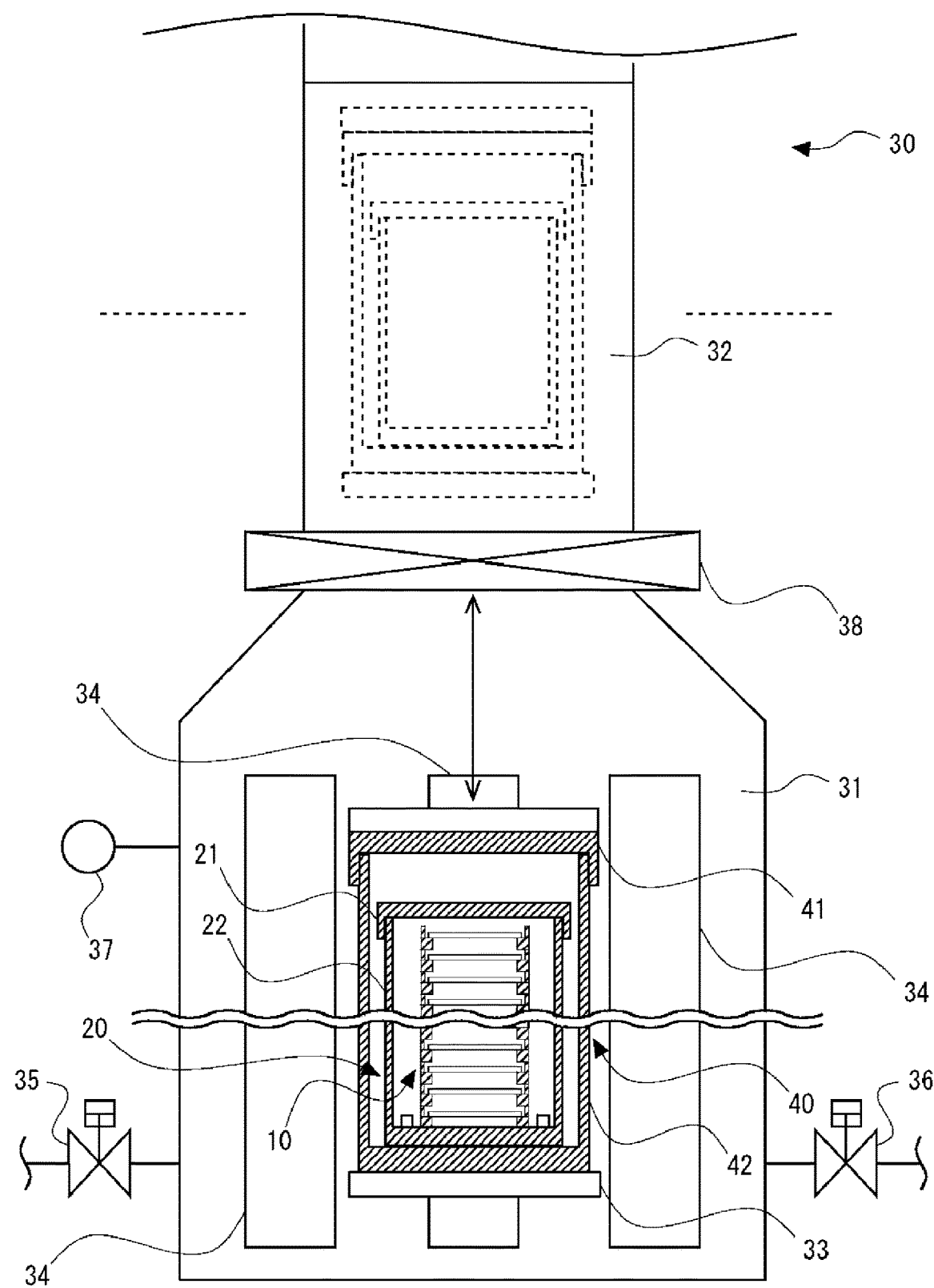
FIG. 9 is an explanatory view of the apparatus for manufacturing a semiconductor substrate according to the embodiment of the present invention.

As illustrated in FIG. 9, the heating furnace 30 is configured to perform heating so as to form the temperature gradient so that the temperature decreases/increases from the upper container 21 toward the lower container 22 of the main container 20. That is, for example, the temperature gradient is formed in the thickness direction of the semiconductor substrate 11.

The heating furnace 30 includes a main heating chamber 31 capable of heating the assembly 10 to a temperature of 1000° C. or higher and 2300° C. or lower, a spare chamber 32 capable of preheating the assembly 10 to a temperature of 500° C. or higher, a high melting point container 40 capable of housing the main container 20, and a moving means 33 capable of moving the high melting point container 40 from the spare chamber 32 to the main heating chamber 31.

A heater 34 (mesh heater) is provided in the main heating chamber 31 as an example.

In addition, a multilayer heat reflective metal plate is fixed to a side wall and a ceiling of main heating chamber 31. The multilayer heat reflective metal plate is configured to reflect the heat of the heater 34 toward a substantially central portion of the main heating chamber 31.

The heater 34 is disposed in the main heating chamber 31 so as to surround the high melting point container 40 in which the assembly 10 is housed. In this case, the multilayer heat reflective metal plate is installed outside the heater 34, so that the temperature can be raised in the temperature range of 1000° C. or more and 2300° C. or less.

As an example of the heater 34, a resistance heating type heater or a high frequency induction heating type heater can be adopted.

The heater 34 may adopt a configuration capable of forming the temperature gradient in the high melting point container 40. As an example, the heater 34 may be configured so that many heaters are installed on the upper side (or lower side). Further, the heater 34 may be configured so that the width increases toward the upper side (or lower side). Alternatively, the heater 34 may be configured to be able to increase the power supplied for heating as it goes upward (or downward).

A vacuum forming valve 35 that exhausts the inside of the main heating chamber 31, an inert gas injection valve 36 that introduces an inert gas into the main heating chamber 31, and a vacuum gauge 37 for measuring the degree of vacuum in the main heating chamber 31 are connected to the main heating chamber 31.

The vacuum forming valve 35 can be connected to a vacuum drawing pump that evacuates and draws a vacuum from the inside of the main heating chamber 31. The degree of vacuum in the main heating chamber 31 can be adjusted to preferably 10 Pa or less, more preferably 1 Pa or less, and still more preferably $10^{-3}$ Pa or less by the vacuum forming valve 35 and the vacuum drawing pump. Examples of the vacuum drawing pump include a turbo molecular pump and a rotary pump.

The inert gas injection valve 36 can be connected to an inert gas supply source. By the inert gas injection valve 36 and the inert gas supply source, an inert gas such as Ar can be introduced into the main heating chamber 31 in the range of $10^{-5}$ to $10^4$ Pa.

The inert gas injection valve 36 is a dopant gas supply means capable of supplying a dopant gas into the main container 20. That is, by selecting the dopant gas (for example, $N_2$ or the like) as the inert gas, the doping concentration of the growth layer 111 can be increased.

The spare chamber 32 is connected to the main heating chamber 31, and is configured so that the high melting point container 40 can be moved by the moving means 33. Note that the temperature of the spare chamber 32 according to the embodiment of the present invention can be raised by residual heat of the heater 34 of the main heating chamber 31. As an example, when the temperature of the main heating chamber 31 is raised to 2000° C., the temperature of the spare chamber 32 is raised to about 1000° C., and the assembly 10, the main container 20, or the like can be degassed.

The moving means 33 is configured to be movable between the main heating chamber 31 and the spare chamber 32 while mounting and holding the high melting point container 40. In this case, a moving table on which the high melting point container 40 is mounted is moved in a vertical direction by a motor or the like. A moving tool for mounting and holding the high melting point container 40 may be configured to be rotatable around a shaft extending in a vertical direction. Note that each member constituting the moving means 33 is preferably made of a material of a semiconductor substrate.

The conveyance between the main heating chamber 31 and the spare chamber 32 by the moving means 33 is completed in about 1 minute at the shortest, and thus, temperature rising and temperature falling at 1 to 1000° C./min can be realized.

As a result, since rapid temperature rising and rapid temperature falling can be performed, it is possible to observe a surface shape having no low-temperature growth history during temperature rising and temperature falling. In addition, in FIG. 9, the spare chamber is installed above the main heating chamber 31. However, the present invention is not limited thereto, and the spare chamber 32 may be installed in any direction.

The moving means 33 according to the embodiment of the present invention is, for example, the moving table on which the high melting point container 40 is mounted. The contact portion of the moving table and the high melting point container 40 becomes a heat propagation path.

As a result, the temperature gradient can be formed in the high melting point container 40 so that the contact portion side of the moving table and the high melting point container 40 becomes the low temperature side.

In the heating furnace 30 according to the embodiment of the present invention, since the bottom portion of the high melting point container 40 is in contact with the moving table, the temperature gradient is provided so that the temperature decreases from the upper container 41 toward the lower container 42 of the high melting point container 40.

The direction of the temperature gradient can be set to any direction by changing the position of the contact portion of the moving table and the high melting point container 40. As an example, in a case where a suspension type or the like is adopted for the moving table and the contact portion is provided on the ceiling of the high melting point container 40, heat escapes upward. Therefore, the temperature gradient is provided so that the temperature rises from the upper container 41 toward the lower container 42 of the high melting point container 40. In addition, as described above, the temperature gradient may be formed by the configuration of the heater 34.

The heating furnace 30 includes a gate valve 38 between the main heating chamber 31 and the spare chamber 32.

The gate valve 38 is a transport system gate valve having such a dimension that the assembly 10 can be carried in and out by the moving means 33 and holding the degree of vacuum of the main heating chamber 31. The gate valve 38 can be adopted in various modes as long as it is the conventional means such as a valve plate that opens and closes a gate opening leading to the main heating chamber 31, a valve shaft to which the valve plate is attached, and an air cylinder that drives the valve shaft.

<High Melting Point Container>

Figure 10:
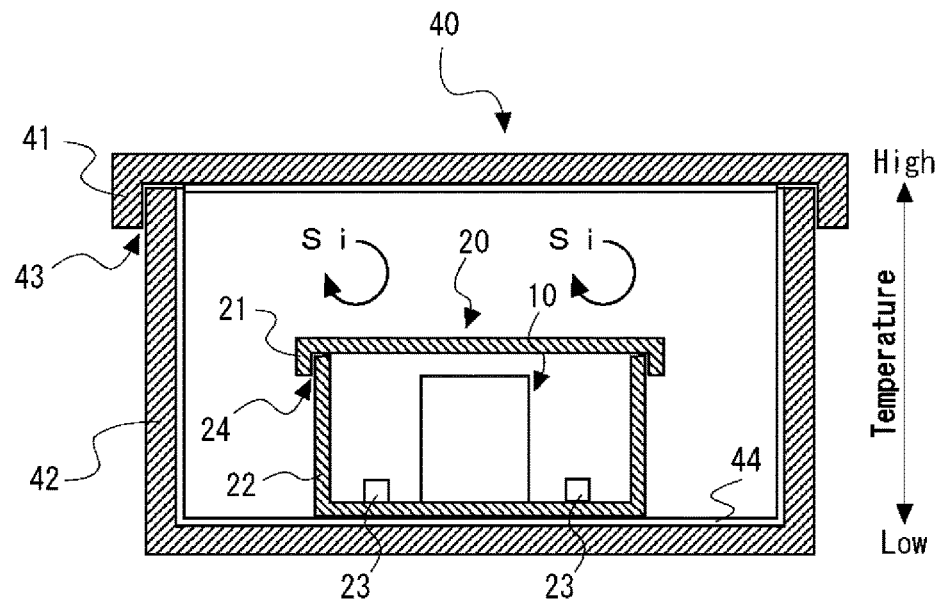
FIG. 10 is an explanatory view of the apparatus for manufacturing a semiconductor substrate according to the embodiment of the present invention.

As illustrated in FIG. 10, the high melting point container 40 can house the main container 20.

Similarly to the main container 20, the high melting point container 40 is a fitting container including the upper container 41 and the lower container 42 that can be fitted to each other, and is configured to be able to house the main container 20. The minute gap 43 is formed in the fitting portion between the upper container 41 and the lower container 42, and the inside of the high melting point container 40 can be exhausted (evacuated) from the gap 43.

The high melting point container 40 includes a vapor supply material 44 capable of supplying the vapor pressure of the vapor phase species containing the Si element into the high melting point container 40.

The vapor supply material 44 may be configured to generate the Si vapor in the high melting point container 40 during the heat treatment, and is, for example, a thin film covering an inner wall of the high melting point container 40.

When the high melting point container 40 is a metal compound such as TaC, the vapor supply material 44 is, for example, a Silicide material of metal atoms and Si atoms constituting the high melting point container 40.

Since the high melting point container 40 has the vapor supply material 44 inside, it is possible to hold the vapor pressure environment of the gas phase species containing the Si element in the main container 20. It can be understood that this is because the vapor pressure of the gas phase species containing the Si element in the main container 20 and the vapor pressure of the gas phase species containing the Si element outside the main container 20 are balanced.

The vapor pressure environment of the gas phase species containing the Si element in the heating furnace 30 according to the embodiment of the present invention is formed using the high melting point container 40 and the vapor supply material 44. As an example, a method capable of forming a vapor pressure environment of a gas phase species containing an Si element around a main container 20 can be adopted in the configuration of the present invention.

The high melting point container 40 is preferably configured to contain a high melting point material having a melting point equal to or higher than the melting point of the material constituting the main container 20.

Examples of the high melting point container 40 can include C which is a general purpose heat resistant member, W, Re, Os, Ta, and Mo which are high melting point metals, Ta9C8, HfC, TaC, NbC, ZrC, Ta$_2$C, TiC, WC, and MoC which are carbides, HfN, TaN, BN, Ta$_2$N, ZrN, and TiN which are nitrides, HfB$_2$, TaB$_2$, ZrB$_2$, NB$_2$, and TiB$_2$ which are borides, and SiC polycrystals, and the like.

The member made of the material of the semiconductor substrate 11 according to the embodiment of the present invention refers to the installation tool 13 or the main container 20. That is, the materials of the installation tool 13 and the main container 20 are the materials of the semiconductor substrates 11 and 12. Therefore, at least a part of the installation tool 13 or the main container 20 can be a transport source or a transport destination in the raw material transport according to the embodiment of the present invention.

Reference Example 1 to 3 is shown below.

Reference Example 1

Under the following conditions, the SiC single crystal substrate E10 was housed in the main container 20, and furthermore, the main container 20 was housed in the high melting point container 40.
<SiC Single Crystal Substrate E10>
 Polymorph: 4H—SiC
 Substrate size: Horizontal width (10 mm), vertical width (10 mm), and thickness (0.3 mm)
 Off direction and Off angle: <11-20> direction 4° off
 Growth surface: (0001) surface
 Presence or absence of MSB: Absence
<Main Container 20>
 Material: SiC polycrystal
 Container size: Diameter (60 mm), height (4 mm)
 Distance between SiC single crystal substrate E10 and SiC material: 2 mm
 Atomic number ratio Si/C in container: 1 or less
<High Melting Point Container 40>
 Material: TaC
 Container size: Diameter (160 mm), height (60 mm)
 Vapor supply material 44 (Si compound): TaSi$_2$
The SiC single crystal substrate E10 disposed under the above conditions was subjected to a heat treatment under the following conditions.
 Heating temperature: 1700° C.
 Heating time: 300 min
 Temperature gradient: 1° C./mm
 Growth rate: 5 nm/min
 Degree of vacuum of main heating chamber 31: $10^{-5}$ Pa FIG. 11 is an explanatory diagram of a method for obtaining a conversion rate obtained by converting BPD into another defect/dislocation (TED or the like) in a growth layer E11.

Figure 11:
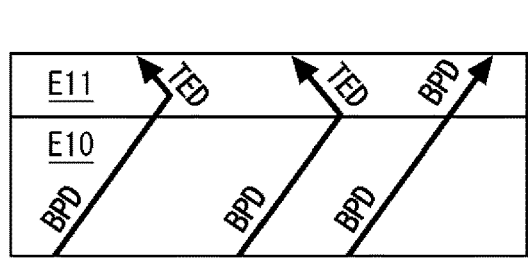
FIG. 11 is an explanatory view related to evaluation of the number of BPDs in an SiC substrate in Reference Example 1.
Figure 11:
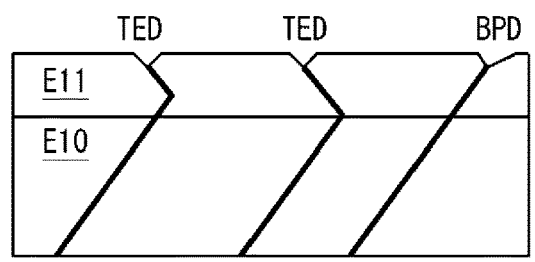
Figure 11:
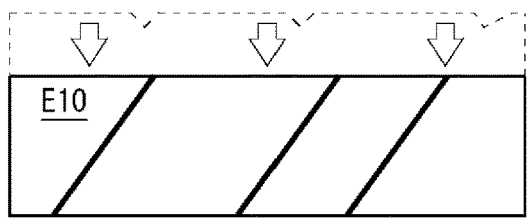
Figure 11:
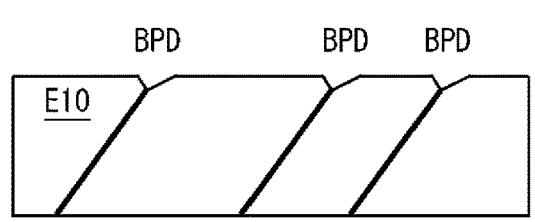

FIG. 11(*a*) illustrates a state in which the growth layer E11 is grown by the heating process. In the heating process, the BPD existing in the SiC single crystal substrate E10 is converted into TED with a certain probability. Therefore, unless 100% conversion is performed, the TED and the BPD are mixed on the surface of the growth layer E11.

FIG. 11(*b*) illustrates a state in which a defect in the growth layer E11 is confirmed using the KOH dissolution etching method. This KOH dissolution etching method is a method of immersing the SiC single crystal substrate E10 in a dissolved salt (KOH or the like) heated to about 500° C., forming etch pits in dislocations or defect portions, and determining a type of dislocations on the basis of the size and shape of the etch pits. By this method, the number of BPDs existing on the surface of the growth layer E11 is obtained.

FIG. 11(*c*) illustrates a state in which the growth layer E11 is removed after the KOH dissolution etching. In this method, after planarized to the depth of the etch pit by mechanical polishing, CMP, or the like, the growth layer E11 is removed by thermal etching to expose the surface of the SiC single crystal substrate E10.

FIG. 11(*d*) illustrates a state in which the defects in the SiC single crystal substrate E10 are confirmed using the KOH dissolution etching method with respect to the SiC single crystal substrate E10 from which the growth layer E11 has been removed. By this method, the number of BPDs existing on the surface of the SiC single crystal substrate E10 is obtained.

By comparing the number of BPDs existing on the surface of the growth layer E11 (see FIG. 11(*b*)) with the number of BPDs existing on the surface of the SiC single crystal substrate E10 (FIG. 11(*d*)) in the series of order illustrated in FIG. 11, it is possible to obtain the BPD conversion rate converted from BPD to other defects/dislocations during the heating process.

The number of BPDs existing on the surface of the growth layer E11 of Reference Example 1 was about 0 cm$^{-2}$, and the number of BPDs existing on the surface of the SiC single crystal substrate E10 was 1000 cm$^{-2}$.

That is, it can be understood that the BPD is reduced or removed by disposing the SiC single crystal substrate E10 having no MSB on the surface in the quasi-closed space in which the atomic number ratio Si/C is 1 or less and heating the SiC single crystal substrate E10.

In Reference Example 1, the SiC—C equilibrium vapor pressure environment is formed in the main container 20 so that the atomic number ratio Si/C in the main container 20 is 1 or less.

Since the heating process including the etching process in the above method and the heating process including the etching process according to the embodiment of the present invention are based on the same reaction element process, it can be understood that BPD can be reduced or removed even in the etching process according to the embodiment of the present invention Reference Example 2

Under the following conditions, the SiC single crystal substrate E10 was housed in the main container 20, and furthermore, the main container 20 was housed in the high melting point container 40.
<SiC Single Crystal Substrate E10>
 Polymorph: 4H—SiC
 Substrate size: Horizontal width (10 mm), vertical width (10 mm), and thickness (0.3 mm)
 Off direction and Off angle: <11-20> direction 4° off
 Growth surface: (0001) surface
 Presence or absence of MSB: Presence
<Main Container 20>
 Material: SiC polycrystal
 Container size: Diameter (60 mm), height (4 mm)

Distance between SiC single crystal substrate E10 and SiC material: 2 mm
Vapor supply source 23: Si piece
Atomic number ratio Si/C in container: more than 1
By housing the Si piece together with the SiC single crystal substrate in the main container 20, the atomic number ratio Si/C in the container exceeds 1.

<High Melting Point Container 40>
Material: TaC
Container size: Diameter (160 mm)×height (60 mm)
Vapor supply material 44 (Si compound): TaSi$_2$ The SiC single crystal substrate E10 disposed under the above conditions was subjected to a heat treatment under the following conditions.

Figure 12:
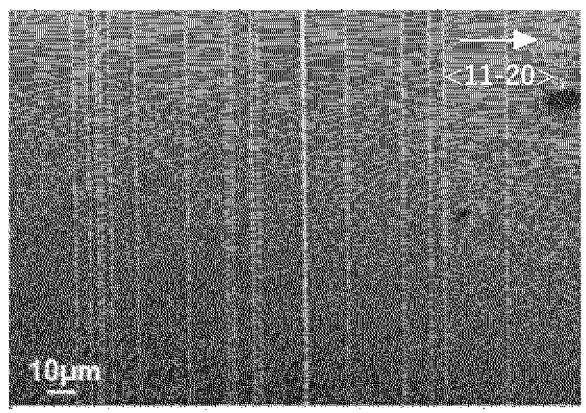
FIG. 12 is an SEM image of a surface of an SiC substrate in Reference Example 2.
Figure 12:
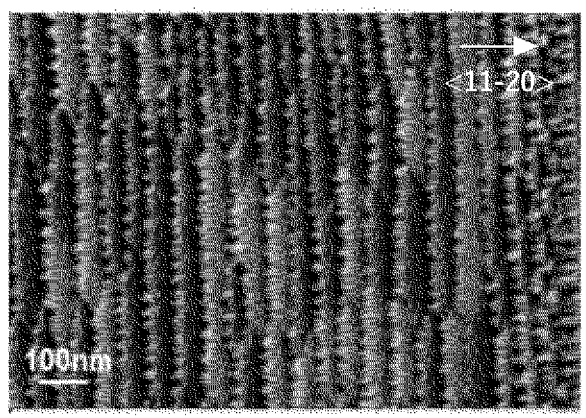

Heating temperature: 1800° C.
Heating time: 60 min
Temperature gradient: 1° C./mm
Growth rate: 68 nm/min
Degree of vacuum of main heating chamber 31: 10$^{-5}$ Pa FIG. 12 is an SEM image of the surface of the SiC single crystal substrate E10 before the growth of the growth layer E11. FIG. 12(a) is a SEM image observed at a magnification×1000, and FIG. 12(b) is a SEM image observed at a magnification×100,000.

It can be understood that the MSB is formed on the surface of the SiC single crystal substrate E10 before the growth of the growth layer E11, and steps having a height of 3 nm or more are arranged with a terrace width of 42 nm on average. Note that the step height was measured by AFM.

Figure 13:
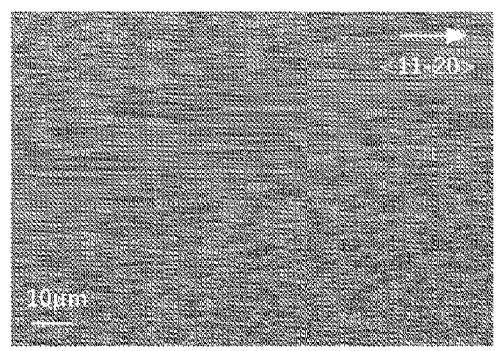
FIG. 13 is the SEM image of the surface of the SiC substrate in Reference Example 2.
Figure 13:
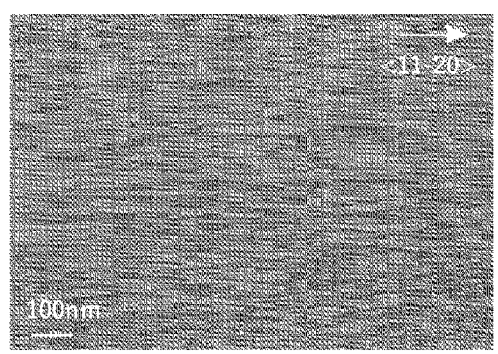

FIG. 13 is an SEM image of the surface of the SiC single crystal substrate E10 after the growth of the growth layer E11. FIG. 13(a) is a SEM image observed at a magnification×1000, and FIG. 13(b) is a SEM image observed at a magnification×100,000.

It can be understood that the MSB is not formed on the surface of the growth layer E11 of Reference Example 2, and steps of 1.0 nm (full unit cell) are regularly arranged with a terrace width of 14 nm. Note that the step height was measured by AFM.

Therefore, it can be understood that the growth layer E11 in which the MSB is decomposed is formed by disposing the SiC single crystal substrate E10 in which the MSB exists on the surface in the quasi-closed space in which the atomic number ratio Si/C exceeds 1 and heating the SiC single crystal substrate E10.

In Reference Example 2, since the vapor supply source 26 is installed so that the atomic number ratio Si/C in the main container 20 exceeds 1, the SiC—Si equilibrium vapor pressure environment is formed in the main container 20.

Since the heating process including the etching process in the above method and the heating process including the etching process according to the embodiment of the present invention are based on the same reaction element process, it can be understood that the MSB on the surface of the SiC single crystal substrate can be decomposed even in the etching process according to the embodiment of the present invention.

Reference Example 3

Figure 14:
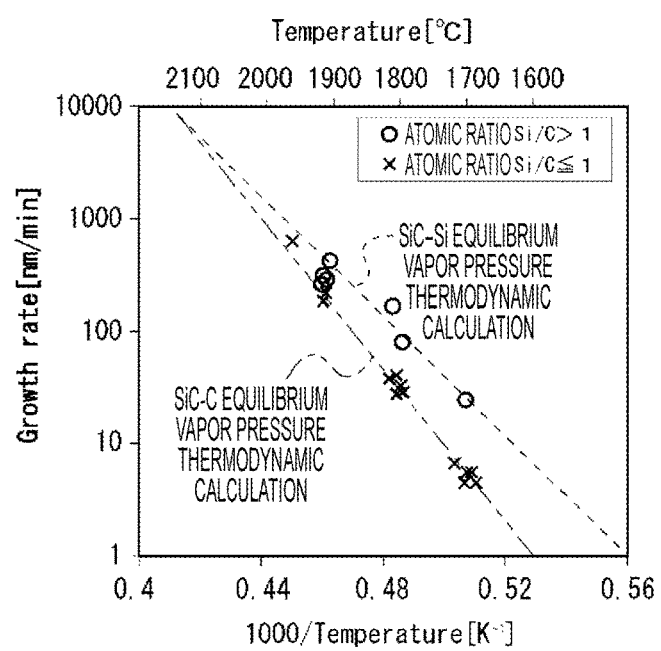
FIG. 14 is a correlation diagram between a growth rate and a heating temperature of the SiC substrate in Reference Example 3.

FIG. 14 is a graph illustrating the relationship between the heating temperature and the growth rate of the SiC single crystal substrate grown by the method of manufacturing an SiC single crystal substrate according to the present invention. A horizontal axis of the graph represents a reciprocal of the temperature, and a vertical axis of the graph represents the growth rate in logarithmic form. A result of growing the growth layer E11 on the SiC single crystal substrate E10 by disposing the SiC single crystal substrate E10 in the space (in the main container 20) in which the atomic number ratio Si/C exceeds 1 is indicated by O mark. In addition, the result of growing the growth layer E11 on the SiC single crystal substrate E10 by disposing the SiC single crystal substrate E10 in the space (in the main container 20) in which the atomic number ratio Si/C is 1 or less is indicated by x mark.

In addition, in the graph of FIG. 14, the result of the thermodynamic calculation of the SiC substrate growth in the SiC—Si equilibrium vapor pressure environment is indicated by a broken line (Arrhenius plot), and the result of the thermodynamic calculation of the SiC substrate growth in the SiC—C equilibrium vapor pressure environment is indicated by a two-dot chain line (Arrhenius plot).

In the present method, the SiC single crystal substrate E10 is grown using a chemical potential difference or a temperature gradient as a growth driving force under the condition that the vapor pressure environment between the SiC raw material and the SiC substrate is the SiC—C equilibrium vapor pressure environment or the SiC—C equilibrium vapor pressure environment. This chemical potential difference can be exemplified by a partial pressure difference between the gas phase species generated on the surfaces of the SiC polycrystal and the SiC single crystal.

Here, when the partial pressure difference of the vapor generated from the SiC raw material (transport source) and the SiC substrate (transport destination) is defined as the growth amount, the SiC growth rate is obtained by the following Equation 1.

Equation 1

Here, T is a temperature on the SiC raw material side, $m_i$ is a molecular weight of a gas phase species ($Si_xC_y$), and k is a Boltzmann constant.

In addition, the $P_{transport\ source\ i} - P_{transport\ destination\ i}$ is a growth amount in which the raw material gas is supersaturated and precipitated as SiC, and SiC, $Si_2C$, and $SiC_2$ are assumed as the raw material gas.

That is, the broken line indicates the result of the thermodynamic calculation when an SiC single crystal is grown using SiC polycrystal as a raw material in the vapor pressure environment when SiC (solid) and Si (liquid phase) are in the phase equilibrium state via the gas phase.

Specifically, using Equation 1, the thermodynamic calculation was performed under the following conditions (i) to (iv). (i) The SiC—Si equilibrium vapor pressure environment in which a volume is constant, (ii) the temperature gradient in the main container 20 and the vapor pressure difference (chemical potential difference) between the SiC polycrystal and the SiC single crystal, (iii) SiC, $Si_2C$, or $SiC_2$ as the raw gas, and (iv) an adsorption coefficient at which the source material is adsorbed to the step of the SiC single crystal substrate E10 is 0.001.

In addition, the two-dot chain line is a result of the thermodynamic calculation when the SiC single crystals are grown using SiC polycrystals as raw materials in the vapor pressure environment when the SiC (solid phase) and the C (solid phase) are in the phase equilibrium state via the gas phase.

Specifically, using Equation 1, the thermodynamic calculation was performed under the following conditions (i) to (iv). (i) The SiC—C equilibrium vapor pressure environment in which a volume is constant, (ii) growth driving force is the temperature gradient in the main container 20 and the vapor pressure difference (chemical potential difference)

between the SiC polycrystal and the SiC single crystal, (iii) SiC, Si$_2$C, or SiC$_2$ as the raw gas, and (iv) an adsorption coefficient at which the source material is adsorbed to the step of the SiC single crystal substrate E10 is 0.001.

Note that as data of each chemical species used for the thermodynamic calculation, values in a JANAF thermochemical table were adopted.

According to the graph of FIG. 14, it is found that the result (O mark) of growing the growth layer E11 on the SiC single crystal substrate E10 by disposing the SiC single crystal substrate E10 in the space (inside the main container 20) in which the atomic number ratio Si/C exceeds 1 is consistent with the result of the thermodynamic calculation of the SiC growth in the SiC—Si equilibrium vapor pressure environment.

In addition, it can be understood that the result (x mark) of growing the growth layer E11 on the SiC single crystal substrate E10 by disposing the SiC single crystal substrate E10 in the space (in the main container 20) in which the atomic number ratio Si/C is 1 or less is consistent with the result of the thermodynamic calculation of the SiC growth in the SiC—C equilibrium vapor pressure environment.

Under the SiC—Si equilibrium vapor pressure environment, it is estimated that a growth rate of 1.0 μm/min or more is achieved at a heating temperature of 1960° C. In addition, it is estimated that a growth rate of 2.0 μm/min or more is achieved at a heating temperature of 2000° C. or more.

On the other hand, under the SiC—C equilibrium vapor pressure environment, it is estimated that a growth rate of 1.0 μm/min or more is achieved at a heating temperature of 2000° C. In addition, it is estimated that a growth rate of 2.0 μm/min or more is achieved at a heating temperature of 2030° C. or higher.

According to the present invention, it is possible to improve the throughput in the manufacturing of the semiconductor substrate.

Figure 15:
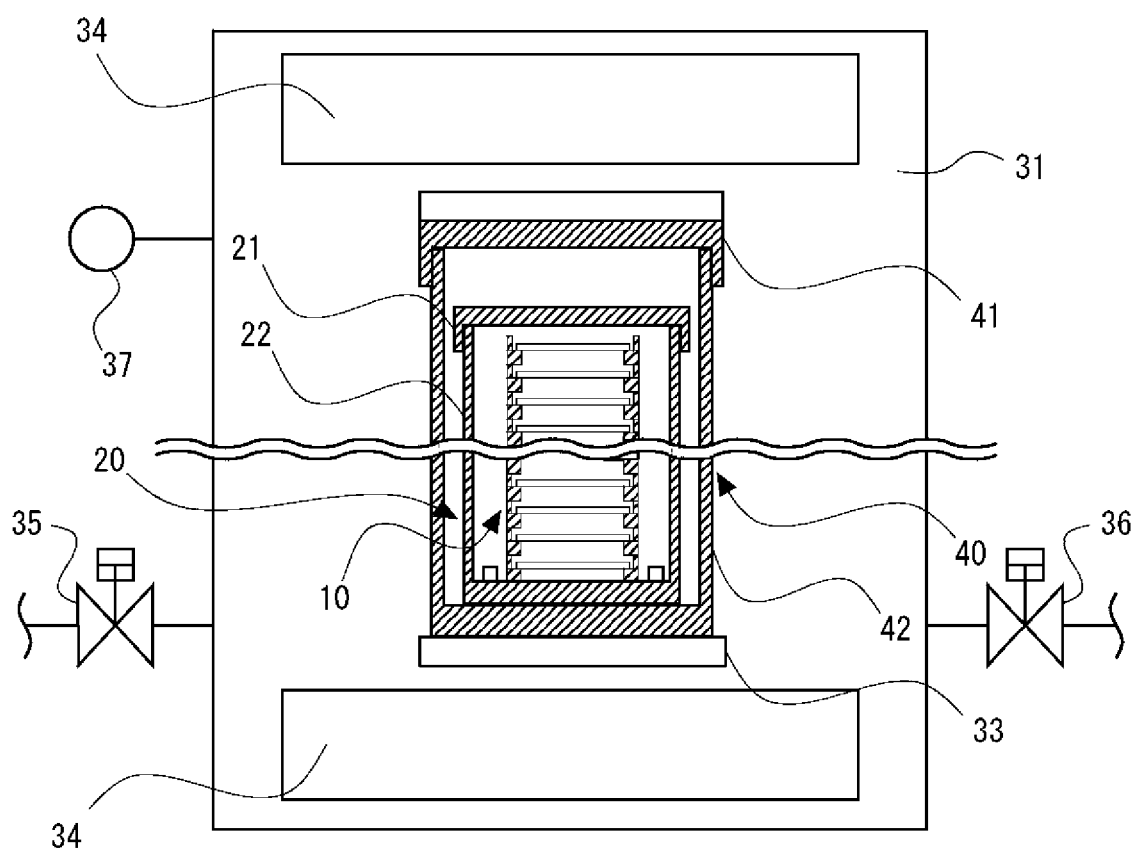
FIG. 15 is an explanatory view of an apparatus for manufacturing a semiconductor substrate according to another embodiment of the present invention.

In addition, FIG. 15 is an explanatory diagram of an apparatus for manufacturing a semiconductor substrate according to another embodiment of the present invention.

As illustrated in FIG. 15, the heater 34 as a heating source may be disposed in a direction intersecting the main surface of the semiconductor substrate 11. Then, the temperature gradient may be formed by providing a temperature difference between the heater 34 disposed at the upper portion and the heater 34 disposed at the lower portion.

In addition, the heater 34 has a heating portion that generates heat, and an area of the heating portion is desirably set to be equal to or larger than an area of the semiconductor substrate 11.

As described above, by disposing the heater 34 at the upper portion and the lower portion, the temperature distribution on the surface of one semiconductor substrate 11 can be made substantially uniform and the heating can be performed.

REFERENCE SIGNS LIST

S0 Raw material transport space
D0 Transport distance
10 Assembly
100 Processing unit
11 Semiconductor substrate
111, 121 Growth layer
113, 123 Main surface
114, 124 Back surface
12 Semiconductor substrate
123 Main surface
124 Back surface
13 Installation tool
13A Upper edge
13B Lower edge
13C Bottom portion
131 Abutting surface
14 Dummy substrate
20 Main container
21, 41 Upper container
22, 42 Lower container
23 Vapor supply source
24, 43 Gap
30 Heating furnace
31 Main heating chamber
32 Spare chamber
33 Moving means
34 Heater
35 Vacuum forming valve
36 Inert gas injection valve
37 Vacuum gauge
38 Gate valve
40 High melting point container
44 Vapor supply material

The invention claimed is:

1. A method for manufacturing a semiconductor substrate, comprising:
    installing a plurality of objects to be processed having SiC semiconductor substrates in a stack such that adjacent SiC semiconductor substrates are facing each other; and
    heating each of the plurality of objects to be processed so that a temperature gradient is formed in a thickness direction of the SiC semiconductor substrate,
    wherein the heating includes:
    etching a surface of one SiC semiconductor substrate, which is the source of material transport, disposed on a high temperature side of the temperature gradient; and
    growing a growth layer on a surface of another SiC semiconductor substrate, which is the material transport destination, disposed on a low temperature side of the temperature gradient.

2. The manufacturing method according to claim 1, wherein in the installing, the objects to be processed are installed in a quasi-closed space.

3. The manufacturing method according to claim 1, wherein in the installing, the objects to be processed is installed so that the adjacent semiconductor substrates face each other.

4. The manufacturing method according to claim 1, wherein
    in the heating, the plurality of objects to be processed are heated in an atmosphere containing atomic species constituting the semiconductor substrate.

5. An epitaxial growth method, comprising:
    arranging a plurality of SiC semiconductor substrates in a thickness direction of the SiC semiconductor substrates so that adjacent SiC semiconductor substrates are facing each other, and
    heating the SiC semiconductor substrates so that a temperature gradient is formed in the thickness direction of the SiC semiconductor substrates, thereby transporting a raw material from one SiC semiconductor substrate disposed on a high temperature side to another semiconductor substrate disposed on a low temperature side; and crystal-growing the semiconductor substrate by taking over a polymorph of the semiconductor substrate on the low temperature side,
wherein the heating includes:
etching a surface of the SiC semiconductor substrate, which is the source of material transport, disposed on a high temperature side of the temperature gradient.

6. The epitaxial growth method according to claim 5, wherein
the plurality of semiconductor substrates is crystal-grown simultaneously.

7. The epitaxial growth method according to claim 5, wherein
a dummy substrate is disposed at substantially end portions of the plurality of arranged semiconductor substrates.

8. The epitaxial growth method according to claim 5, wherein
the semiconductor substrate is disposed and grown in a raw material transport space exhausted through a vapor pressure space of vapor phase species containing atomic species constituting the semiconductor substrate.

9. The epitaxial growth method according to claim 5, wherein the semiconductor substrate is silicon carbide, and the semiconductor substrate is disposed and grown in a raw material transport space exhausted through an Si vapor pressure space.

10. The epitaxial growth method according to claim 9, wherein
the semiconductor substrate is disposed and heated in a quasi-closed space in which an atomic number ratio Si/C exceeds 1.

11. The epitaxial growth method according to claim 9, wherein
the semiconductor substrate is disposed and heated in a quasi-closed space in which an atomic number ratio Si/C is 1 or less.

* * * * *